US012081221B2

(12) United States Patent
Elies (10) Patent No.: US 12,081,221 B2
(45) Date of Patent: Sep. 3, 2024

(54) COMPARATOR ARCHITECTURE SUPPORTING LOWER OXIDE BREAKDOWN VOLTAGES

(71) Applicant: TEXAS INSTRUMENTS INCORPORATED, Dallas, TX (US)

(72) Inventor: Brian Roger Elies, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/679,978

(22) Filed: Feb. 24, 2022

(65) Prior Publication Data

US 2023/0090005 A1 Mar. 23, 2023

Related U.S. Application Data

(60) Provisional application No. 63/247,348, filed on Sep. 23, 2021.

(51) Int. Cl.
*H03K 5/24* (2006.01)
*H03K 19/0185* (2006.01)

(52) U.S. Cl.
CPC ... *H03K 5/2481* (2013.01); *H03K 19/018521* (2013.01)

(58) Field of Classification Search
CPC ......... H03K 5/2481; H03K 19/018521; H03K 5/2472; H03K 19/09432; H03K 5/08; H03K 5/249; H03K 5/24; H03F 3/45183; H03F 2203/45101; H03F 2200/78; H03F 2203/45586
See application file for complete search history.

(56) References Cited

U.S. PATENT DOCUMENTS

| 9,083,232 | B1* | 7/2015 | Agarwal | H03F 3/45183 |
| 9,236,466 | B1* | 1/2016 | Lee | H01L 29/6659 |
| 10,317,925 | B2* | 6/2019 | Agarwal | H03F 3/45632 |
| 10,627,838 | B1* | 4/2020 | Saito | G05F 1/468 |
| 11,405,030 | B1* | 8/2022 | Mustafi | H03F 3/45269 |
| 11,444,612 | B2* | 9/2022 | Agarwal | H03F 1/0205 |
| 2015/0200632 | A1* | 7/2015 | Panja | H03F 3/45753 330/253 |
| 2018/0226960 | A1* | 8/2018 | Goya | H03K 5/19 |

FOREIGN PATENT DOCUMENTS

WO 03061118 A1 7/2003

* cited by examiner

*Primary Examiner* — Lincoln D Donovan
*Assistant Examiner* — Tyler J Pereny
(74) *Attorney, Agent, or Firm* — Brian D. Graham; Frank D. Cimino; Xianghui Huang (57) ABSTRACT

A circuit includes a transistor input pair, a differential input having a comparator input, and a level shifter. The transistor input pair is adapted to be coupled between a voltage supply and a comparator output. The transistor input pair includes a first transistor having a gate and a drain. The drain of the first transistor is coupled to the comparator output. The level shifter is coupled between the transistor input pair and the differential input. The level shifter includes a second transistor having a gate and a source. The gate of the second transistor is coupled to the comparator input. The source of the second transistor is coupled to the gate of the first transistor.

24 Claims, 4 Drawing Sheets

COMPARATOR ARCHITECTURE SUPPORTING LOWER OXIDE BREAKDOWN VOLTAGES

CROSS-REFERENCE TO RELATED APPLICATIONS

The present application claims priority to U.S. Provisional Patent Application No. 63/247,348, which was filed Sep. 23, 2021, is titled "A 3.3V RAIL TO RAIL INPUT COMPARATOR USING 1.8V GATE OXIDE DEVICES," and is hereby incorporated herein by reference in its entirety.

BACKGROUND

A comparator is a circuit, component, or device that provides an output having a state indicative of a comparison between input voltages. The output provided by the comparator can have a first state (e.g., a high state) responsive to a first input voltage exceeding a second input voltage. The output provided by the comparator can have a second state (e.g., a low state) responsive to the second input voltage exceeding the first input voltage. Comparators can be formed using transistors and other semiconductor devices. Process node scaling for improving circuit speed, power efficiency, and other benefits can involve reducing a number of device feature sizes such as the gate oxide thickness of a transistor. Reducing gate oxide thickness of transistors forming a comparator can reduce a common mode input range (CMIR) that the comparator can support.

SUMMARY

In accordance with at least one example of the description, a circuit includes a transistor input pair, a differential input having a comparator input, and a level shifter. The transistor input pair is adapted to be coupled between a voltage supply and a comparator output. The transistor input pair includes a first transistor having a gate and a drain. The drain of the first transistor is coupled to the comparator output. The level shifter is coupled between the transistor input pair and the differential input. The level shifter includes a second transistor having a gate and a source. The gate of the second transistor is coupled to the comparator input. The source of the second transistor is coupled to the gate of the first transistor.

In accordance with at least one example of the description, a circuit includes a transistor input pair and a body bias controller. The transistor input pair is adapted to be coupled between a voltage supply and a comparator output. The transistor input pair includes a first transistor having a body, a source, and a drain. The drain of the first transistor is coupled to the comparator output. The body bias controller includes a body bias interface and a second transistor having a gate and a source. The body bias interface is coupled to the body of the first transistor and the source of the second transistor. The gate of the second transistor is coupled to the source of the first transistor In accordance with at least one example of the description, a circuit includes a transistor input pair, a level shifter, and a body bias controller. The transistor input pair is adapted to be coupled between a voltage supply and a comparator output. The transistor input pair includes a first transistor having a gate, a body, and a source. The level shifter is coupled between the transistor input pair and a differential input having a comparator input. The level shifter includes a second transistor having a gate and a source. The gate of the second transistor is coupled to the comparator input. The source of the second transistor is coupled to the gate of the first transistor. The body bias controller includes a body bias interface and a third transistor having a gate and a source. The body bias interface is coupled to the body of the first transistor and the source of the third transistor. The gate of the third transistor is coupled to the source of the first transistor.

DETAILED DESCRIPTION

As described above, process node scaling for improving circuit speed, power efficiency, and other benefits can reduce gate oxide thickness of transistors forming a comparator. Such gate oxide reduction can reduce an input voltage range and/or a common mode input range (CMIR) that a comparator can support. For example, reducing gate oxide thickness of transistors forming a comparator can lower an oxide breakdown voltage ($V_{bd}$) of one or more of the transistors. In some instances, input signals provided to a comparator formed by transistors with reduced gate oxide thickness can include a common mode component or a common mode input voltage ($V_{cm}$) that exceeds $V_{bd}$ of one or more of the transistors. Exceeding the $V_{bd}$ of one or more of the transistors can stress or permanently damage gate oxide material of the transistors, thereby degrading operation of the comparator.

Some existing comparator architectures may expand an input voltage range and/or a CMIR of a comparator with lower oxide breakdown voltages using an external resistor divider. The external resistor divider may be coupled between a source providing input signals and a comparator input. The external resistor divider may scale the input signals to avoid exceeding the lower oxide breakdown voltages. Other existing comparator architectures may expand an input voltage range and/or a CMIR of a comparator with lower oxide breakdown voltages using an external operational amplifier (op-amp) voltage buffer. The external op-amp voltage buffer may be coupled between a source providing input signals and a comparator input. The external op-amp voltage buffer may also scale the input signals to avoid exceeding the lower oxide breakdown voltages. While effective, adding external components (e.g., the external resistor divider and/or the external op-amp voltage buffer) to provide a comparator with a wide input voltage range and/or CMIR while supporting lower oxide breakdown voltages increases both component costs and system size. Such external components may also compromise comparator performance. For example, the external resistor divider and/or the external op-amp voltage buffer may lower an input impedance of the comparator input to an unacceptable level, increase a response time of the comparator by increasing input latency, introduce noise into the input signals, and/or consume additional power.

Aspects of this description relate to a comparator having a wide input voltage range and/or CMIR while supporting lower oxide breakdown voltages. In at least one example, the comparator includes a level shifter coupled between a differential input and a transistor input pair. The level shifter can be configured to reduce gate-to-source voltage ($V_{gs}$) values within the input pair to facilitate mitigating gate oxide stress. To that end, the level shifter can be configured to apply a voltage shift to a differential input signal provided at the differential input to create a shifted differential input signal for driving the input pair. In various examples, the voltage shift can be proportional to a threshold voltage ($V_t$) of a transistor (e.g., $+V_t$ and/or $-V_t$). While proportional to the differential input signal, a voltage level of the shifted differential input signal can be less than a voltage level of the differential input signal. Accordingly, the level shifter avoids exceeding the lower oxide breakdown voltages without adding external components. In various examples, internal components (e.g., components forming the level shifter) can be added to the comparator to facilitate supporting lower oxide breakdown voltages. Such internal components can be smaller in size relative to the external components described above and/or be provided on-die with the comparator. As such, components cost and/or system size increases associated adding such internal components can be minimal. Component cost and system size increases associated with the external components described above can be avoided.

In at least one example, the comparator can include a body bias controller having a body bias interface that facilitates implementing body bias control within the input pair. The body bias controller can be configured to control a voltage provided at the body bias interface based on a common mode input voltage of a differential input signal provided at the differential input. The body bias controller can be further configured to dynamically adjust the voltage provided at the body bias interface in a manner that tracks input voltage variations of the differential input signal. The body bias controller can be useful to mitigate bias temperature instability (BTI)-induced aging, gate oxide stress, and/or other negative impacts related to degradation or stress events within the input pair without compromising performance of the comparator.

Figure 1:
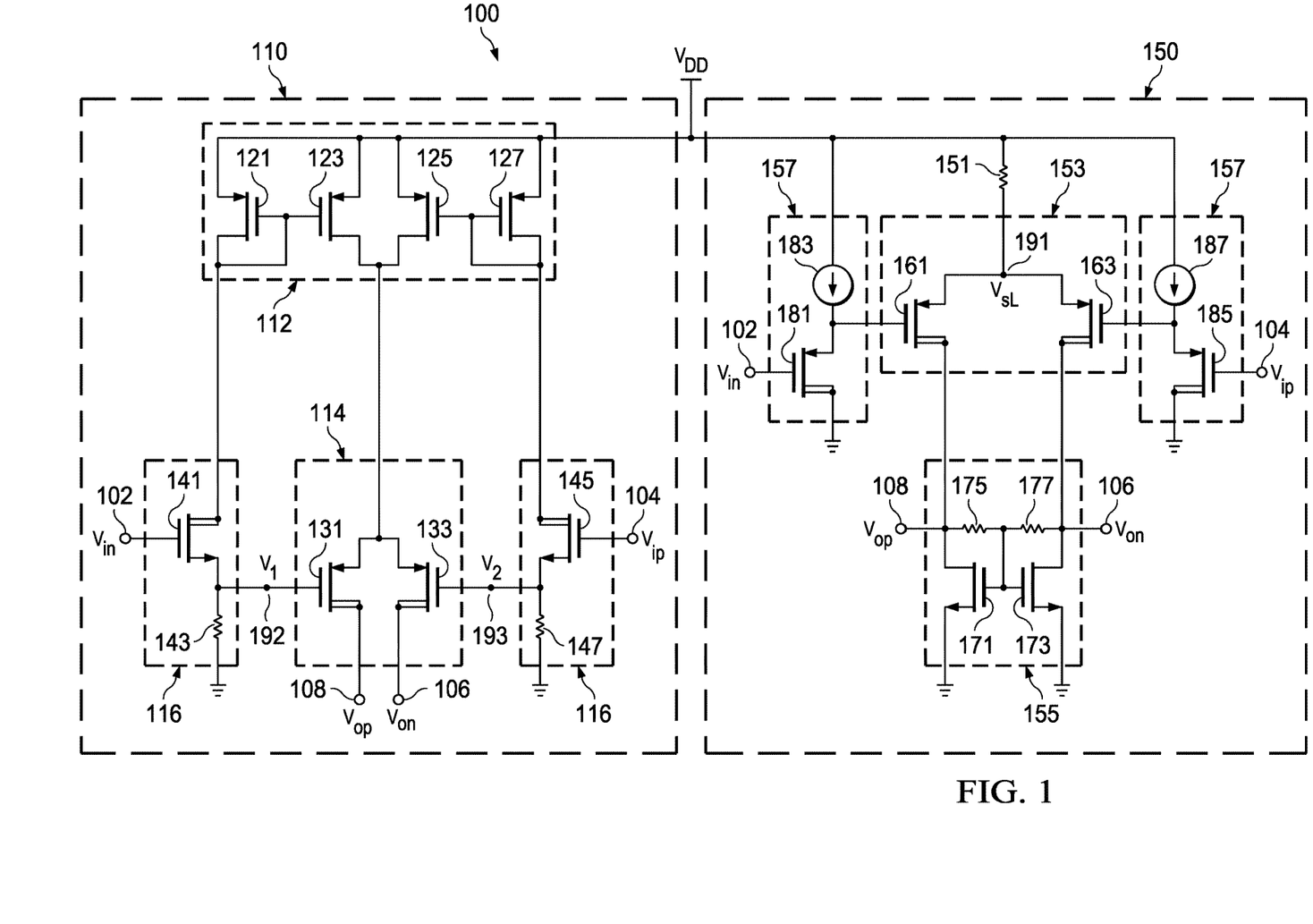
FIG. 1 is a schematic diagram of an example comparator.

FIG. 1 is a schematic diagram of an example comparator 100. At least some implementations of the comparator 100 are representative of an architecture that supports lower oxide breakdown voltages for transistors or other switching devices, such as field-effect transistors (FETs), metal-oxide-semiconductor field-effect transistors (MOSFETs), or bipolar junction transistors (BJTs). The comparator 100 can include a first comparator input 102, a second comparator input 104, a first comparator output 106, a second comparator output 108. The first comparator input 102 and the second comparator input 104 can form a differential input of the comparator 100. A voltage ($V_{in}$) provided at the first comparator input 102 and a voltage ($V_{ip}$) provided at the second comparator input 104 can form a differential input signal. The first comparator output 106 and the second comparator output 108 can form a differential output of the comparator 100. A voltage ($V_{on}$) provided at the first comparator output 106 and a voltage ($V_{op}$) provided at the second comparator output 108 can form a differential output signal.

The comparator 100 can also include a high-side input circuit 110 configured to, responsive to a common mode input voltage ($V_{cm}$) of the differential input signal exceeding a threshold voltage ($V_t$) of a transistor, process the differential input signal. $V_{cm}$ can be determined according to ($V_{in}+V_{ip}$)/2. The high-side input circuit 110 can include a bias circuit 112, an input pair 114, and a level shifter 116. The bias circuit 112 can include p-type FETs (PFETs) 121, 123, 125, and 127. The input pair 114 can include PFETs 131 and 133. The level shifter 116 can include an n-type FET (NFET) 141, a resistor 143, an NFET 145, and a resistor 147. While various transistors or other switching devices are illustrated and described with respect to the comparator 100 as PFETs or NFETs, in some examples the comparator 100 may be implemented using NFETs where PFETs are shown and vice versa.

In an example architecture of the high-side input circuit 110, a source of the PFET 121 is coupled to a source of the PFET 123, a source of the PFET 125, a source of the PFET 127, and a voltage ($V_{DD}$) provided by a voltage supply. A gate of the PFET 121 is coupled to a drain of the PFET 121, a gate of the PFET 123, and a drain of the NFET 141. A drain of the PFET 123 is coupled to a drain of the PFET 125, a source of the PFET 131, and a source of the PFET 133. A gate of the PFET 125 is coupled to a gate of the PFET 127, a drain of the PFET 127, and a drain of the NFET 145. A gate of the PFET 131 is coupled to a source of the NFET 141 and a first terminal of the resistor 143. A drain of the PFET 131 is coupled to the second comparator output 108. A gate of the PFET 133 is coupled to a source of the NFET 145 and a first terminal of the resistor 147. A drain of the PFET 133 is coupled to the first comparator output 106. A gate of the NFET 141 is coupled to the first comparator input 102. A second terminal of the resistor 143 is coupled to ground. A gate of the NFET 145 is coupled to the second comparator input 104. A second terminal of the resistor 147 is coupled to ground.

The comparator 100 can also include a low-side input circuit 150 configured to process the differential input signal with input voltages having a range of values between about 0 volts and $V_{DD}$-$V_t$. In at least one example, a range of values can exist for $V_{cm}$ in which the high-side input circuit 110 and the low-side input circuit 150 are configured to process the differential input signal. The low-side input circuit 150 can include a resistor 151, an input pair 153, an active load circuit 155, and a level shifter 157. The input pair 153 can include PFETs 161 and 163. The active load circuit 155 can include an NFET 171, an NFET 173, a resistor 175, and a resistor 177. The level shifter 157 can include a PFET 181, a current source 183, a PFET 185, and a current source 187.

In an example architecture of the low-side input circuit 150, a first terminal of the resistor 151 is coupled to $V_{DD}$. A second terminal of the resistor 151 is coupled to a source of the PFET 161 and a source of the PFET 163. A gate of the PFET 161 is coupled to a source of the PFET 181 and a first terminal of the current source 183. A drain of the PFET 161 is coupled to the second comparator output 108, a drain of the NFET 171, and a first terminal of the resistor 175. A gate of the PFET 163 is coupled to a source of the PFET 185 and a first terminal of the current source 187. A drain of the PFET 163 is coupled to the first comparator output 106, a drain of the NFET 173, and a first terminal of the resistor 177. A source of the NFET 171 is coupled to ground. A gate of the NFET 171 is coupled to a gate of the NFET 173, a second terminal of the resistor 175, and a second terminal of the resistor 177. A source of the NFET 173 is coupled to ground. A gate and a drain of the PFET 181 are coupled to the first comparator input 102 and ground, respectively. A second terminal of the current source 183 is coupled to $V_{DD}$. A gate and a drain of the PFET 185 are coupled to the second comparator input 104 and ground, respectively. A second terminal of the current source 187 is coupled to $V_{DD}$.

In at least one example, the comparator 100 can include a drain-extended transistor that can support higher drain voltages than non-drain-extended transistors. For example, FIG. 1 includes a number of drain-extended transistors, such as the PFET 131, the PFET 133, the NFET 141, the NFET 145, the PFET 161, the PFET 163, the PFET 181, and the PFET 185. While various transistors or other switching devices are illustrated and described with respect to the comparator 100 as drain-extended transistors or non-drain-extended transistors, in some examples the comparator 100 may be implemented using drain-extended transistors where non-drain-extended transistors are shown and vice versa.

In operation, the comparator 100 is configured to, responsive to the differential input signal (e.g., $V_{in}$ and $V_{ip}$) provided at the first comparator input 102 and the second comparator input 104, provide the differential output signal (e.g., $V_{on}$, and $V_{op}$) at the first comparator output 106 and the second comparator output 108. In at least one example, the comparator 100 is configured to provide the differential output signal asynchronously responsive to the differential input signal provided at the first comparator input 102 and the second comparator input 104. Responsive to $V_{in}$ being greater than $V_{ip}$, the differential output signal provided by the comparator 100 can be in a high state where $V_{op}$ is greater than $V_{on}$. Responsive to $V_{ip}$ being greater than $V_{in}$, the differential output signal provided by the comparator 100 can be in a low state where $V_{on}$ is greater than $V_{op}$. In at least one example, the first comparator output 106 and the second comparator output 108 are adapted to be coupled to a logic circuit (not shown) that is configured to convert the differential output signal into a digital signal. In this example, the digital signal can assume a high-level (e.g., a logic "1") and a low-level (e.g., a logic "0") when the differential output signal is in the high state and low state, respectively.

Process node scaling can reduce a gate oxide thickness of one or more transistors (e.g., PFETs 131, 133, 161, and/or 163) forming the comparator 100. Reducing the gate oxide thickness can lower a $V_{bd}$ of the one or more transistors forming the comparator 100. In some instances, the lower $V_{bd}$ can reduce a CMIR that the input pair 114 and/or the input pair 153 can support. By way of example, the input pair 153 can be directly driven with a differential input signal. In this example, $V_{cm}$ of the differential input signal can be about 3.3 volts with $V_{DD}$ having a value of about 3.3 volts, $V_{in}$ of the differential input signal having a value of $V_{DD}$, and $V_{ip}$ of the differential input signal having a value of about 0 volts or ground.

Responsive to the input pair 153 being directly driven with the differential input signal, $V_{in}$ having a value of $V_{DD}$ or about 3.3 volts can be provided to the gate of the PFET 161 and $V_{ip}$ having a value of about 0 volts can be provided to the gate of the PFET 163. Responsive to $V_{DD}$ or about 3.3 volts and about 0 volts being provided to the gates of the PFET 161 and the PFET 163, respectively, a voltage ($V_{sL}$) can be provided at a node 191 coupled to the respective sources of PFETs 161 and 163. A value of $V_{sL}$ provided at the node 191 in this example can be determined according to $V_{DD}$-$V_{t,161}$, where $V_{t,161}$ is a threshold voltage of the PFET 161. $V_{t,161}$ can be subtracted from $V_{DD}$ by operation of the PFET 161. In that instance, if $V_{t,161}$ is 1 volt, a gate-to-source voltage ($V_{gs,163}$) of the PFET 163 can be about 2.3 volts. If less than a $V_{bd}$ of gate oxide material forming the PFET 163, the $V_{gs,163}$ of about 2.3 volts can induce stress on the gate oxide material. Permanent damage such as rupturing of the gate oxide material can occur if the $V_{gs,163}$ of about 2.3 volts is greater than or equal to the $V_{bd}$ of the gate oxide material.

The level shifter 116 and the level shifter 157 are configured to reduce $V_{gs}$ values within the input pair 114 and the input pair 153, respectively, to facilitate mitigating such gate oxide stress. To that end, the level shifter 116 and/or the level shifter 157 are configured to apply a voltage shift (e.g., $+V_t$ and/or $-V_t$) to a differential input signal provided at a differential input of the comparator 100. Applying the fractional gain to the differential input signal can create an attenuated differential input signal for driving the input pair 114 and/or the input pair 153. While proportional to the differential input signal, a voltage level of the attenuated differential input signal can be less than a voltage level of the differential input signal.

In at least one example, the voltage shift of the level shifter 116 and/or the level shifter 157 can be determined according to a number of transistors that are coupled between the differential input and a corresponding input pair in a source follower arrangement. In FIG. 1, level shifters 116 and 157 each include one transistor coupled between the differential input and a corresponding input pair in a source follower arrangement. The NFET 141 is coupled between the first comparator input 102 and the gate of the PFET 131 in a source follower arrangement. The NFET 145 is coupled between the second comparator input 104 and the gate of the PFET 133 in a source follower arrangement. The PFET 181 is coupled between the first comparator input 102 and the gate of the PFET 161 in a source follower arrangement. The PFET 185 is coupled between the second comparator input 104 and the gate of the PFET 163 in a source follower arrangement.

Cascading additional transistors (e.g., 2 and/or 3, etc.) in a source follower arrangement between the differential input and a corresponding input pair can further reduce the voltage level of the shifted differential input signal relative to the differential input signal. For example, the level shifter 116 can include an additional transistor coupled between the first comparator input 102 and the NFET 141 in a source follower arrangement and/or an additional transistor coupled between the second comparator input 104 and the NFET 145 in a source follower arrangement. In this example, a voltage level of an attenuated differential input signal created by the level shifter 116 having two transistors cascaded in a source follower arrangement can be less than a voltage level of an attenuated differential input signal created by the level shifter 116 of FIG. 1 that has one transistor cascaded in a source follower arrangement.

Figure 2:
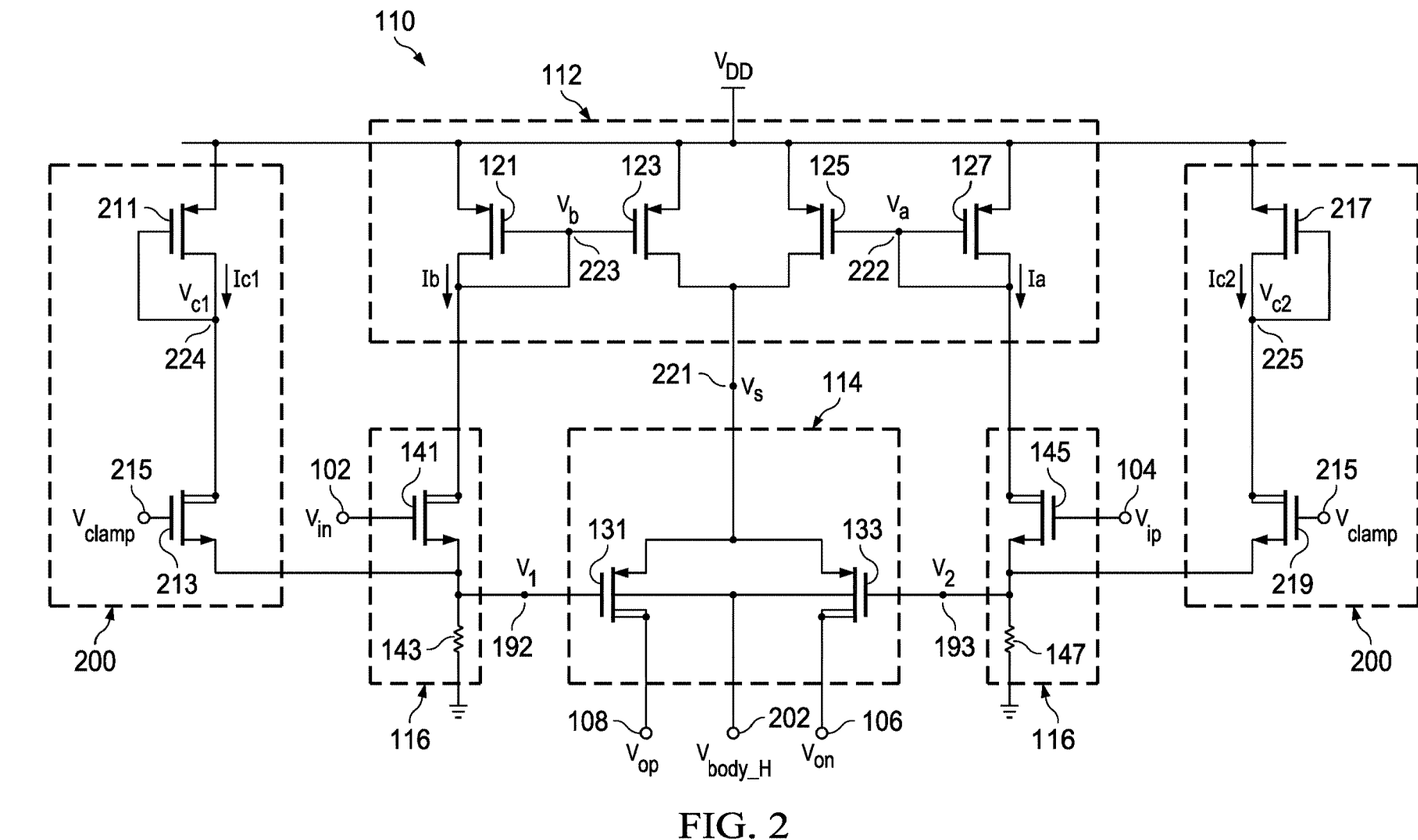
FIG. 2 is a schematic diagram of an example implementation of a high-side input circuit.

FIG. 2 is a schematic diagram of an example implementation of the high-side input circuit 110. In at least some examples, the high-side input circuit 110 can include a clamp circuit 200 and a high-side body interface 202. The clamp circuit 200 can include a PFET 211, an NFET 213, a clamp interface 215, a PFET 217, and an NFET 219. In an example architecture of the high-side input circuit 110, a body of the PFET 131 is coupled to a body of the PFET 133 and the high-side body interface 202. A source of the PFET 211 is coupled to $V_{DD}$. A gate of the PFET 211 is coupled to a drain of the PFET 211 and a drain of the NFET 213. A gate of the NFET 213 is coupled to the clamp interface 215.

A source of the NFET 213 is coupled to the source of the NFET 141, the first terminal of the resistor 143, and the gate of the PFET 131. A source of the PFET 217 is coupled to $V_{DD}$. A gate of the PFET 217 is coupled to a drain of the PFET 217 and a drain of the NFET 219. A gate of the NFET 219 is coupled to the clamp interface 215. A source of the NFET 219 is coupled to a source of the NFET 145, the first side of the resistor 147, and the gate of the PFET 133.

As described above, processing of the differential input signal provided to the comparator 100 varies based on a value of $V_{cm}$. The high-side input circuit 110 can process the differential input signal responsive to $V_{cm}$ exceeding $V_t$. The low-side input circuit 150 processes the differential input signal responsive to a voltage difference between $V_{DD}$–$V_t$ and 0 volts exceeding $V_{cm}$. With reference to FIG. 1, that variation in processing of the differential input signal can involve operation of the active load circuit 155. For example, responsive to providing the differential input signal to the comparator 100, current can flow through the resistor 151 of the low-side input circuit 150. By operation of the active load circuit 155, the current flowing through the high-side input circuit 110 and the low-side input circuit 150 can be combined.

In some instances, operation of the active load circuit 155 can induce cross-leakage current within the high-side input circuit 110. By way of example, a differential input signal can be provided to the first comparator input 102 and the second comparator input 104. $V_{cm}$ of the differential input signal can be below $V_t$. In this example, $V_{cm}$ of the differential input signal can be below $V_t$ responsive to $V_{in}$ and $V_{ip}$ both having respective values of about 0 volts or ground. Responsive to providing the differential input signal, a threshold voltage ($V_{t,173}$) of the NFET 173 can be provided to the respective drains of NFETs 171 and 173, as non-zero current flows through the resistor 151. Because the respective drains of the PFET 131 and the NFET 171 are each coupled to the second comparator output 108, $V_{t,173}$ can also be provided to the drain of the PFET 131. $V_{t,173}$ can also be provided to the drain of the PFET 133 in as much as the respective drains of the PFET 133 and the NFET 173 are each coupled to the first comparator output 106.

Responsive to providing the differential input signal, about 0 volts or ground can be provided to a node 192 coupled to the gate of the PFET 131 and a node 193 coupled to the gate of the PFET 133. The PFET 131 can become active (e.g., turned on) responsive to a voltage ($V_1$) at the node 192 being less than a voltage (e.g., $V_{t,173}$) at the second comparator output 108. The PFET 133 can become active (e.g., turned on) responsive to a voltage ($V_2$) at the node 193 being less than a voltage (e.g., $V_{t,173}$) at the first comparator output 106. With PFETs 131 and 133 each being active, cross-leakage current can flow between the first comparator output 106 and the second comparator output 108. In effect, a short condition can be created between the first comparator output 106 and the second comparator output 108. The short condition can induce non-linear operation by the comparator 100.

With reference to FIG. 2, the clamp circuit 200 is configured to reduce cross-leakage current within the input pair 114. To that end, the clamp circuit 200 is configured to control $V_1$ at the node 192 and/or $V_2$ at the node 193 based on a voltage ($V_{clamp}$) provided at the clamp interface 215. Responsive to $V_{clamp}$, the PFET 211 and the NFET 213 can provide a first clamp current ($I_{c1}$). $I_{c1}$ can flow through the resistor 143 to provide a non-zero voltage (e.g., about 1 volts) at the node 192. Providing the non-zero voltage at the node 192 facilitates clamping $V_1$ to a voltage level that exceeds a voltage level of $V_{op}$ provided at the second comparator output 108. Clamping $V_1$ to the voltage level that exceeds the voltage level of $V_{op}$ is useful to inhibit the PFET 131 from becoming active while $V_t$ exceeds $V_{cm}$ of the differential input signal. Stated differently, clamping $V_1$ to the voltage level that exceeds the voltage level of $V_{on}$ facilitates maintaining the PFET 131 inactive (e.g., turned off) while $V_t$ exceeds $V_{cm}$ of the differential input signal.

Responsive to $V_{clamp}$, the PFET 217 and the NFET 219 can provide a second clamp current ($I_{c2}$). I2 can flow through the resistor 147 to provide a non-zero voltage (e.g., about 1 volts) at the node 193. Providing the non-zero voltage at the node 193 facilitates clamping $V_2$ to a voltage level that exceeds a voltage level of $V_{on}$ provided at the first comparator output 106. Clamping $V_2$ to the voltage level that exceeds the voltage level of $V_{on}$ is useful to inhibit the PFET 133 from becoming active while $V_t$ exceeds $V_{cm}$ of the differential input signal. Stated differently, clamping $V_2$ to the voltage level that exceeds the voltage level of $V_{on}$ facilitates maintaining the PFET 133 inactive (e.g., turned off) while $V_t$ exceeds $V_{cm}$ of the differential input signal.

Figure 3:
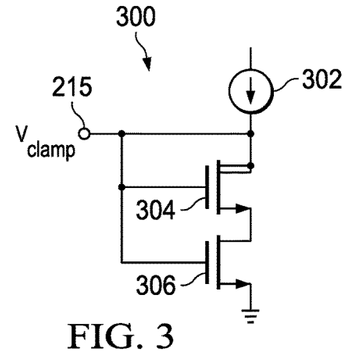
FIG. 3 is a schematic diagram of an example clamp driver circuit.

FIG. 3 is a schematic diagram of an example clamp driver circuit 300. In at least one example, the clamp driver circuit 300 is coupled to the clamp interface 215. The clamp driver circuit 300 can include a current source 302, an NFET 304, and an NFET 306. In an example architecture of the clamp driver circuit 300 the NFET 304 is coupled in series with the NFET 306. A drain of the NFET 304 is coupled to the clamp interface 215, a gate of the NFET 304, and a gate of the NFET 306. A source of the NFET 304 is coupled to a drain of the NFET 306. A source of the NFET 306 is coupled to ground. In operation, the current source 302 is configured to sink current to ground.

Figure 4:
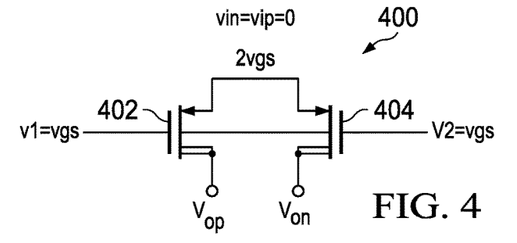
FIG. 4 is a diagram of an example degradation or stress event that can negatively impact performance and/or reliability of semiconductor devices.
Figure 5:
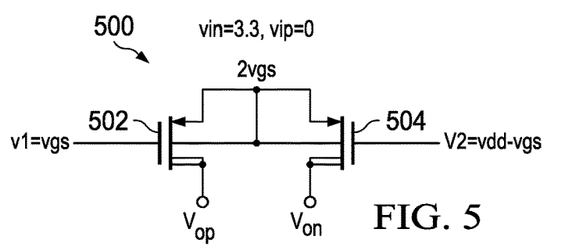
FIG. 5 is a diagram of another example degradation or stress event that can negatively impact performance and/or reliability of semiconductor devices.

Various degradation or stress events can negatively impact performance and/or reliability of semiconductor devices, as shown by FIGS. 4-5. FIG. 4 is a diagram of an example degradation or stress event in which a voltage difference between a gate and a body of a transistor or a gate-to-body voltage ($V_{gb}$) can stress a gate oxide material of the transistor. In FIG. 4, an input pair 400 that includes PFETs 402 and 404. A body or n-well region of the PFET 402 is coupled to $V_{DD}$ and a body or n-well region of the PFET 404. If $V_{DD}$ has a value of about 3.3 volts, a body voltage ($V_b$) of about 3.3 volts can be provided to the respective bodies of PFETs 402 and 404. The input pair 400 can represent an implementation of the input pair 114 in which the respective bodies of PFETs 131 and 133 are tied to $V_{DD}$.

In operation, a differential input signal can be provided to a differential input of a comparator that includes the input pair 400. $V_{cm}$ of the differential input signal can be about 0 volts with respective values of $V_{in}$ and $V_{ip}$ being about 0 volts or ground. Responsive to providing the differential input signal to the differential input, a gate voltage ($V_g$) of $V_t$ or about 1 volt can be provided to the respective gates of PFETs 402 and 404. In that instance, PFETs 402 and 404 can each be subject to a $V_{gb}$ of about 2.3 volts with the $V_b$ of about 3.3 volts exceeding the $V_g$ of $V_t$ or about 1 volt. If less than a $V_{bd}$ of gate oxide material forming PFETs 402 and 404, the $V_{gb}$ of about 2.3 volts can induce stress on the gate oxide material. Permanent damage such as rupturing of the gate oxide material can occur if the $V_{gb}$ of about 2.3 volts is greater than or equal to the $V_{bd}$ of the gate oxide material. FIG. 4 represents gate oxide stress that can occur within an input pair of the comparator 100 when $V_b$ (e.g., about 3.3 volts) exceeds $V_g$ (e.g., about 1 volt) responsive to providing a differential input signal with $V_{cm}$ having a low value (e.g., about 0 volts).

FIG. 5 is a diagram of another example degradation or stress event in which BTI can induce excessive aging of a semiconductor device. In FIG. 5, an input pair 500 includes PFETs 502 and 504. A body or n-well region of the PFET 502 is coupled to a source of the PFET 502, a body or n-well region of the PFET 504, and a source of the PFET 504. The input pair 500 can represent an implementation of the input pair 114 in which the respective bodies of PFETs 131 and 133 are tied to a node (e.g., node 221 of FIG. 2) coupled to the respective sources of PFETs 131 and 133.

In operation, a differential input signal can be applied to a differential input of a comparator that includes the input pair 500. The differential input signal can comprise $V_{in}$ having a value of about 3.3 volts and $V_{ip}$ having a value of about 0 volts or ground. Applying the differential input signal to the differential input can provide a gate voltage ($V_{g,502}$) having a value of $V_t$ or about 1 volt to a gate of the PFET 502 and a gate voltage ($V_{g,504}$) of $V_{DD} - V_t$ to a gate of PFET 504. If $V_{DD}$ is about 3.3 volts, $V_{g,504}$ can be about 2.3 volts. Responsive to providing $V_{g,502}$ to the gate of the PFET 502 and $V_{g,504}$ to the gate of PFET 504, a body voltage ($V_{b,502}$) can be provided to the body of the PFET 502 and a body voltage ($V_{b,504}$) can be provided to the body of the PFET 504. $V_{b,502}$ and $V_{b,504}$ can each have a value of $2*V_t$ or about 2 volts. While $V_{b,504}$ is less than $V_{g,504}$, a bias condition exists for PFET 504 that can subject the PFET 504 to positive BTI (PBTI). Subjecting the PFET 504 to PBTI can alter a threshold voltage ($V_{t,504}$) of the PFET 504. Altering $V_{t,504}$ of the PFET 504 can negatively impact performance of the comparator that includes the input pair 500. For example, an accuracy of the comparator can be reduced by altering $V_{t,504}$ of the PFET 504. FIG. 5 represents BTI-induced aging that can occur within an input pair of the comparator 100 when $V_b$ (e.g., about 2 volts) decreases below $V_g$ (e.g., about 2.3 volts) responsive to providing a differential input signal with $V_{cm}$ having a high value (e.g., about 3.3 volts).

Figure 6:
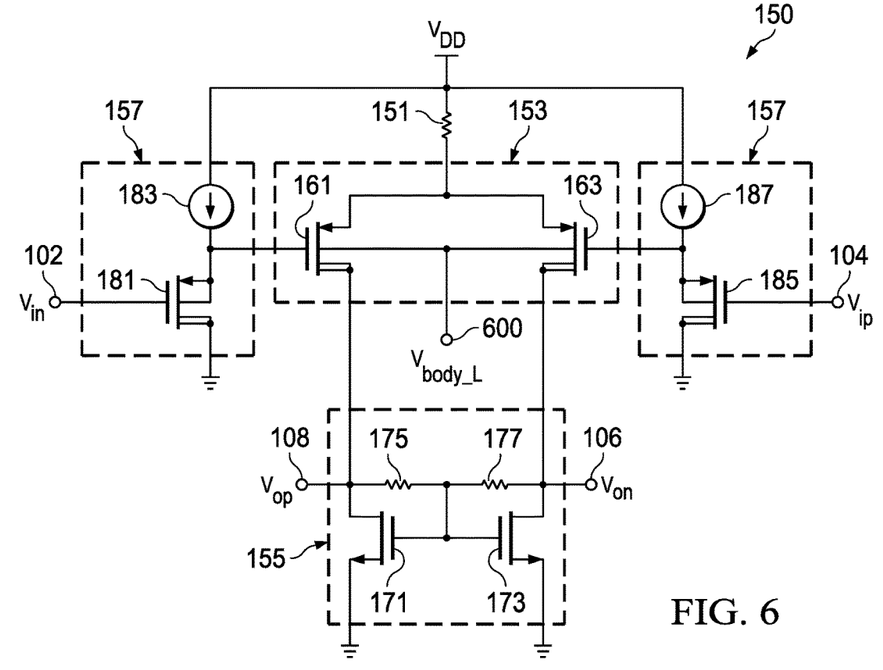
FIG. 6 is a schematic diagram of an example implementation of a high-side input circuit.

In at least one example, body bias control can be useful to the comparator 100 for mitigating BTI-induced aging, gate oxide stress, and/or other negative impacts related to degradation or stress events. Body bias control refers to controlling a voltage difference between a source and a body of a transistor or a source-to-body voltage ($V_{sb}$) to dynamically adjust $V_t$ of the transistor. Body bias control can involve reverse body biasing (RBB) that increases $V_t$ of the transistor and forward body biasing (FBB) that decreases $V_t$ of the transistor. In at least one example, the high-side body interface 202 of FIG. 2 can be useful to implement body bias control within the high-side input circuit 110 of the comparator 100. FIG. 6 is a schematic diagram of an example implementation of the low-side input circuit 150 that includes a low-side body interface 600. In an example architecture of the low-side input circuit 150, the low-side body interface 600 is coupled to a body of the PFET 161 and a body of the PFET 163. In at least one example, the low-side body interface 600 can be useful to implement body bias control within the low-side input circuit 150 of the comparator 100.

With reference to FIG. 2, a current ($I_a$) flowing through the PFET 127 and/or a current ($I_b$) flowing through the PFET 121 can include information about a differential input signal provided at the first comparator input 102 and the second comparator input 104. For example, responsive to the high-side input circuit 110 processing the differential input signal, $I_a$ can flow through the resistor 143 to provide $V_1$ at the node 192 and $I_b$ can flow through the resistor 147 to provide $V_2$ at the node 193. A voltage ($V_a$) provided at a node 222 coupled to the gate of the PFET 127 can be useful to mirror $I_a$. A voltage ($V_b$) provided at a node 223 coupled to the gate of the PFET 121 can be useful to mirror $I_b$.

$I_{c1}$ and/or $I_{c2}$ can also include information about the differential input signal provided at the first comparator input 102 and the second comparator input 104. For example, the clamp circuit 200 can provide, responsive to providing the differential input signal, $I_{c1}$ flowing through the resistor 143 and $I_{c2}$ flowing through the resistor 147, as described above. In this example, $I_{c1}$ flowing through the resistor 143 can also provide $V_1$ at the node 192 and $I_{c2}$ flowing through the resistor 147 can also provide $V_2$ at the node 193. A voltage ($V_{c1}$) provided at a node 224 coupled to the gate and the drain of the PFET 211 can be useful to mirror $I_{c1}$. A voltage ($V_{c2}$) provided at a node 225 coupled to the gate and the drain of the PFET 217 can be useful to mirror $I_{c2}$.

As described above, a gate oxide stress issue can occur within an input pair of the comparator 100 when $V_b$ exceeds $V_g$ responsive to providing a differential input signal with $V_{cm}$ having a relatively low value (e.g., about 0 volts). BTI-induced aging can also occur within an input pair of the comparator 100 when $V_b$ (e.g., about 2 volts) decreases below $V_g$ (e.g., about 2.3 volts) responsive to providing a differential input signal with $V_{cm}$ having a high value (e.g., about 3.3 volts). Controlling $V_b$ provided to an input pair of the comparator 100 in a manner that tracks $V_{cm}$ variations of a differential input signal can facilitate mitigating such negative impacts of degradation or stress events.

Figure 7:
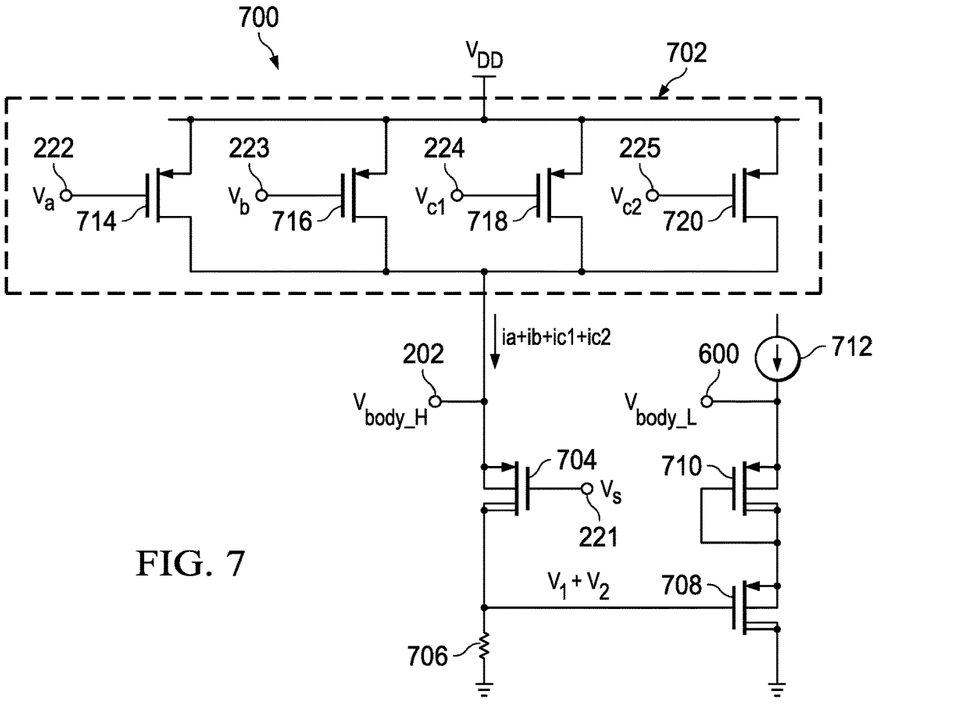
FIG. 7 is a schematic diagram of an example body bias controller.

FIG. 7 is a schematic diagram of an example body bias controller 700. In at least some examples, the body bias controller 700 can include a current mirror circuit 702, a PFET 704, a resistor 706, a PFET 708, a PFET 710, and a current source 712. The current mirror circuit 702 can include PFETs 714-720. In an example architecture of the body bias controller 700, each source of PFETs 714-720 is coupled to VDD. Each drain of PFETs 714-720 is coupled to the high-side body interface 202 and a source of the PFET 704. A gate of the PFET 714 is coupled to the node 222. A gate of the PFET 716 is coupled to the node 223. A gate of the PFET 718 is coupled to the node 224. A gate of the PFET 720 is coupled to the node 225. A gate of the PFET 704 is coupled to the node 221. A drain of the PFET 704 is coupled to a first terminal of the resistor 706 and a gate of the PFET 708. A second terminal of the resistor 706 and a drain of the PFET 708 are each coupled to ground. A source of the PFET 708 is coupled to a drain and a gate of the PFET 710. A source of the PFET 710 is coupled to the low-side body interface 600 and the current source 712.

The body bias controller 700 is configured to control a voltage ($V_{body\_H}$) provided at the high-side body interface 202 and/or a voltage ($V_{body\_L}$) provided at the low-side body interface 600 based on $V_{cm}$ of a differential input signal provided at a differential input of the comparator 100. Information about the differential input signal provided at the first comparator input 102 and the second comparator input 104 forming the differential input can be obtained using the current mirror circuit 702. To that end, the current mirror circuit 702 can mirror $I_a$, $I_b$, $I_{c1}$, and $I_{c2}$ to the body bias controller 700 using $V_a$ at the node 222, $V_b$ at the node 223, $V_{c1}$ at the node 224, and $V_{c2}$ at the node 225, respectively. Operation of the PFET 704 can be controlled using $V_s$ at the node 221. $I_a$, $I_b$, $I_{c1}$, and $I_{c2}$ can flow through the resistor 706 responsive to the PFET 704 being active.

Responsive to $I_a$, $I_b$ $I_{c1}$, and $I_{c2}$ flowing through the resistor 706, a voltage at the first terminal of the resistor 706 can be approximately a summation of $V_1$ at the node 192 and $V_2$ at the node 193. By operation of the PFET 704, a value of $V_{body\_H}$ can be determined according to a maximum of $(V_1+V_2, V_s+V_{t,704})$, where $V_{t,704}$ denotes a threshold voltage of the PFET 704. In at least one example, a value of $V_{body\_L}$ can be determined according to $V_1+V_2+V_{t,708}+V_{t,710}$, where $V_{t,708}$ denotes a threshold voltage of the PFET 708 and $V_{t,710}$ denotes a threshold voltage of the PFET 710.

The body bias controller 700 can facilitate mitigating the negative impacts of degradation or stress events on the input pair 114 and/or the input pair 153 by dynamically adjusting $V_{body}$ and/or $V_{body\_L}$ in a manner that tracks $V_{cm}$ variations of the differential input signal. For example, the body bias controller 700 can decrease $V_{body\_H}$ responsive to $V_{cm}$ of the differential input signal decreasing in value. In this example, decreasing $V_{body\_H}$ can facilitate maintaining $V_g$ provided to the respective gates of PFETs 131 and 133 above $V_{body\_H}$ to reduce gate oxide stress within the input pair 114. As another example, the body bias controller 700 can increase $V_{body\_H}$ responsive to $V_{cm}$ of the differential input signal increasing in value. In this example, increasing $V_{body\_H}$ can facilitate maintaining $V_g$ provided to the respective gates of PFETs 131 and 133 below $V_{body\_H}$ to reduce BTI-induced aging within the input pair 114.

Figure 8:
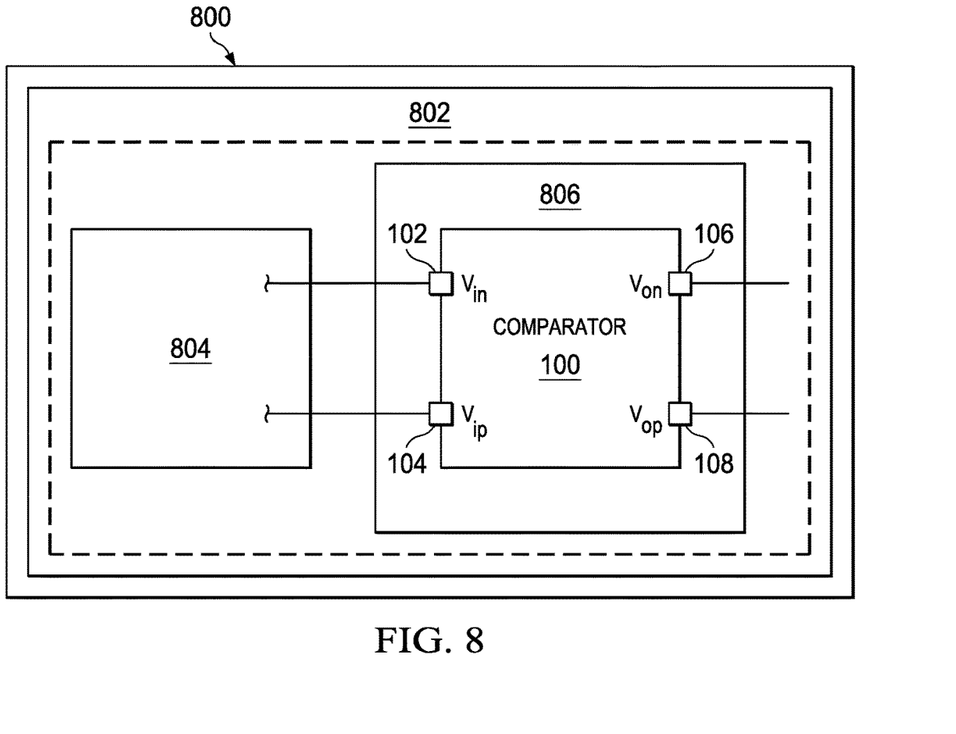
FIG. 8 is a block diagram of an example system that includes the comparator.

FIG. 8 is a block diagram of an example system 800 that includes the comparator 100. At least some implementations of the system 800 are representative of application environments for the comparator 100, such as an automobile, an appliance, a personal electronic device, or other application environments that implement a comparator having a wide CMIR while supporting lower oxide breakdown voltages. In at least some examples, the system 800 includes a printed circuit board 802 having a first semiconductor package 804 and a second semiconductor package 806. The printed circuit board 802 may include one or more conductors (e.g., traces) that couple the first semiconductor package 804 and the second semiconductor package 806. The first semiconductor package 804 and the second semiconductor package 806 can be configured to support different voltage operations (e.g., 1.8-volt operation, 3.3-volt operation, and/or 5-volt operation).

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A comparator comprising:
   a differential input comprising first and second input terminals;
   a first output terminal;
   a first transistor input pair coupled between a voltage supply terminal and the first output terminal, the first transistor input pair including a first transistor having a control terminal and first and second current path terminals, and a second transistor having a first and second current path terminals, wherein the first current path terminal of the first transistor is coupled to the first output terminal, and wherein the second current path terminal of the first transistor is coupled to a first node, and wherein the second current path terminal of the second transistor is coupled to the first node;
   a second transistor input pair coupled between the voltage supply terminal and the first output terminal, the second transistor input pair including a fourth transistor having a first current path terminal coupled to the first output terminal;
   a first level shifter coupled between the first transistor input pair and the differential input, the first level shifter including a third transistor having a control terminal and first and second current path terminals, wherein the control terminal of the third transistor is coupled to the first input terminal, the second current path terminal of the third transistor is coupled to the control terminal of the first transistor, and the first current path terminal of the third transistor is coupled to a reference terminal;
a resistor coupled between the voltage supply terminal and the first node; and
a body bias controller having a first output coupled to a body terminal of the first transistor and to a body terminal of the second transistor, and a second output coupled to a body terminal of the fourth transistor.

2. The comparator of claim 1, further comprising:
an active load circuit coupled between the first transistor input pair and the reference terminal.

3. The comparator of claim 1, wherein the first level shifter further includes a fourth transistor having a control terminal and first and second current path terminals, wherein the control terminal of the fourth transistor is coupled to the second input terminal, and wherein the second current path terminal of the fourth transistor is coupled to the control terminal of the second transistor.

4. The comparator of claim 1, further comprising:
a clamp circuit that includes a fifth transistor having first and second current path terminals, wherein the second current path terminal of the fifth transistor is coupled to a control terminal of the fourth transistor.

5. The comparator of claim 1, further comprising:
a second level shifter coupled between the second transistor input pair and the differential input, the second level shifter including a fifth transistor having first and second current path terminals, wherein the second current path terminal of the fifth transistor is coupled to the control terminal of the fourth transistor.

6. The comparator of claim 5, wherein the second level shifter further includes a resistor having a first terminal and a second terminal, wherein the first terminal of the resistor is coupled to the second current path terminal of the fifth transistor and to the control terminal of the fourth transistor, and the second terminal of the resistor is coupled to the reference terminal.

7. An electronic circuit comprising:
a voltage supply terminal;
a first output terminal;
a first transistor input pair coupled between the voltage supply terminal and the first output terminal, the first transistor input pair including a first transistor having a body terminal and first and second current path terminals, and a second transistor having a body terminal and first and second current path terminals, wherein the first current path terminal of the first transistor is coupled to the first output terminal; and
a body bias controller including:
a first output coupled to the body terminal of the first transistor and to the body terminal of the second transistor, and
a third transistor having a control terminal, and first and second current path terminals, wherein the second current path terminal of the third transistor is coupled to the first output of the body bias controller, and wherein the control terminal of the third transistor is coupled to the first current path terminal of the third transistor,
wherein the first transistor input pair is configured to receive a differential input signal, and
wherein the body bias controller is configured to control a voltage at the first output of the body bias controller based on a common mode input voltage of the differential input signal.

8. The electronic circuit of claim 7, wherein further comprising:
a second transistor input pair coupled between the voltage supply terminal and the first output terminal, the second transistor input pair including a fourth transistor having a body terminal and first and second current path terminals, and a fifth transistor having a body terminal and first and second current path terminals, wherein the body terminal of the fourth transistor is coupled to a second output of the body bias controller, wherein the body bias controller is further configured to control a voltage at the second output of the body bias controller based on the common mode input voltage.

9. The electronic circuit of claim 7, wherein the body bias controller is further configured to dynamically adjust the voltage at the first output of the body bias controller in a manner that tracks common mode input voltage variations of the differential input signal.

10. The electronic circuit of claim 8, further comprising:
a clamp circuit that includes a sixth transistor having a first current path terminal coupled to the control terminal of the fifth transistor.

11. The electronic circuit of claim 7, wherein the first transistor is a p-channel field-effect transistor.

12. An electronic circuit comprising:
a differential input having a comparator input;
an output terminal;
a first transistor input pair coupled between a voltage supply terminal and a comparator output, the first transistor input pair including a first transistor having a gate, a body, and a source;
a level shifter coupled between the first transistor input pair and the differential input, the level shifter including a second transistor having a gate and a source, wherein the gate of the second transistor is coupled to the comparator input, and the source of the second transistor is coupled to the gate of the first transistor; and
a body bias controller including a first output and a third transistor having a gate, a source and a drain, wherein the first output of the body bias controller is coupled to the body of the first transistor and the source of the third transistor, and wherein the body bias controller is configured to control a voltage at the first output of the body bias controller based on a common mode input voltage of a differential input signal received at the differential input.

13. The electronic circuit of claim 12, wherein the body bias controller further includes a second output, the electronic circuit further comprising:
a second transistor input pair coupled between the voltage supply terminal and the comparator output, the second transistor input pair including a fourth transistor having a body that is coupled to the second output of the body bias controller, wherein the body bias controller is further configured to control a voltage at the second output of the body bias controller based on the common mode input voltage.

14. The electronic circuit of claim 12, further comprising:
a clamp circuit that includes a fourth transistor having a source that is coupled to the gate of the first transistor.

15. The electronic circuit of claim 12, wherein a drain of the second transistor is coupled to a ground terminal.

16. The comparator of claim 1, wherein the control terminal of the first transistor, and the first and second current path terminals of the first transistor are gate, drain and source terminals, respectively, of the first transistor, and wherein the control terminal of the second transistor, and the first and second current path terminals of the second transistor are gate, drain and source terminals, respectively, of the second transistor.

17. The comparator of claim 2, wherein the reference terminal is a ground terminal.

18. The comparator of claim 1, wherein the first, second, and third transistors are transistors of the same type.

19. The comparator of claim 1, wherein the first, second, and third transistors are p-type transistors.

20. The comparator of claim 1, wherein the resistor is directly connected between the voltage supply terminal and the first node.

21. The comparator of claim 1, wherein the body bias controller further comprises a current mirror circuit coupled between the voltage supply terminal and the second output of the body bias controller.

22. The electronic circuit of claim 7, further comprising a resistor coupled between the voltage supply terminal and the first transistor input pair.

23. A comparator circuit comprising:
   first and second input terminals configured to receive a differential input signal;
   first and second output terminals;
   a voltage supply terminal;
   a first level shifter having first and second inputs respectively coupled to the first and second input terminals, and first and second outputs;
   first and second transistors having respective control terminals respectively coupled to the first and second outputs of the first level shifter, having respective current paths respectively coupled to the first and second output terminals, and having respective body terminals configured to receive a body voltage;
   a resistor coupled between the voltage supply terminal and the current paths of the first and second transistors; and
   a body bias controller configured to control the body voltage based on a common mode input voltage of the differential input signal.

24. The comparator of claim 16, wherein the source of the second transistor is directly connected to the source of the first transistor.

* * * * *